(12) United States Patent
Baek et al.

(10) Patent No.: US 10,090,381 B2
(45) Date of Patent: Oct. 2, 2018

(54) SEMICONDUCTOR DEVICE INCLUDING AIR-GAP

(71) Applicant: Samsung Electronics Co., Ltd., Suwon-si (KR)

(72) Inventors: Jongmin Baek, Seoul (KR); Vietha Nguyen, Yongin-si (KR); Wookyung You, Incheon (KR); Sangshin Jang, Gwangyang-si (KR); Byunghee Kim, Seoul (KR); Kyu-Hee Han, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/628,675

(22) Filed: Jun. 21, 2017

(65) Prior Publication Data
US 2018/0083099 A1     Mar. 22, 2018

(30) Foreign Application Priority Data

Sep. 20, 2016 (KR) ........................ 10-2016-0120310

(51) Int. Cl.
*H01L 21/70* (2006.01)
*H01L 21/76* (2006.01)
*H01L 29/06* (2006.01)

(52) U.S. Cl.
CPC ................................ *H01L 29/0649* (2013.01)

(58) Field of Classification Search
CPC ........................ H01L 21/76264; H01L 21/764
USPC ........ 438/422, 411, 619, 653; 257/522, 751, 257/767
See application file for complete search history.

(56) References Cited

U.S. PATENT DOCUMENTS

| 6,159,845 | A  | 12/2000 | Yew et al. |
|-----------|----|---------|------------|
| 6,399,476 | B2 | 6/2002  | Kim et al. |
| 7,042,095 | B2 | 5/2006  | Noguchi et al. |
| 7,449,407 | B2 | 11/2008 | Lur et al. |
| 7,473,632 | B2 | 1/2009  | Ueda |
| 7,501,347 | B2 | 3/2009  | Noguchi et al. |
| 7,666,753 | B2 | 2/2010  | Bonilla et al. |

(Continued)

FOREIGN PATENT DOCUMENTS

KR     10-0286126 B1     3/2001

*Primary Examiner* — Calvin Lee
(74) *Attorney, Agent, or Firm* — Muir Patent Law, PLLC

(57) ABSTRACT

A semiconductor device comprises a lower structure on a substrate and including a recess region, first and second barrier layers covering an inner surface of the recess region and a top surface of the lower structure, the inner surface of the recess region including a bottom surface and an inner sidewall connecting the bottom surface to the top surface of the lower structure, and an interlayer dielectric layer provided on the second barrier layer and defining an air gap in the recess region. A first step coverage is obtained by dividing a thickness of the first barrier layer on an inner sidewall of the recess region by a thickness of the first barrier layer on the top surface of the lower structure. A second step coverage is obtained by dividing a thickness of the second barrier layer on the inner sidewall of the recess region by a thickness of the second barrier layer on the top surface of the lower structure. The first step coverage is different from the second step coverage.

20 Claims, 12 Drawing Sheets

(56) References Cited

U.S. PATENT DOCUMENTS

| | | | |
|---|---|---|---|
| 8,120,179 B2* | 2/2012 | Chanda | H01L 21/7682 |
| | | | 257/751 |
| 8,288,268 B2 | 10/2012 | Edelstein et al. | |
| 9,293,388 B2 | 3/2016 | Rao et al. | |
| 9,524,904 B2* | 12/2016 | Ohori | H01L 21/76843 |
| 9,653,400 B2* | 5/2017 | Yim | H01L 23/53295 |
| 9,728,447 B2* | 8/2017 | Lin | H01L 21/76289 |
| 9,754,821 B2* | 9/2017 | King | H01L 21/02178 |
| 2016/0030079 A1* | 2/2016 | Cohen | H01L 23/5226 |
| 2016/0093566 A1 | 3/2016 | Ting et al. | |

* cited by examiner

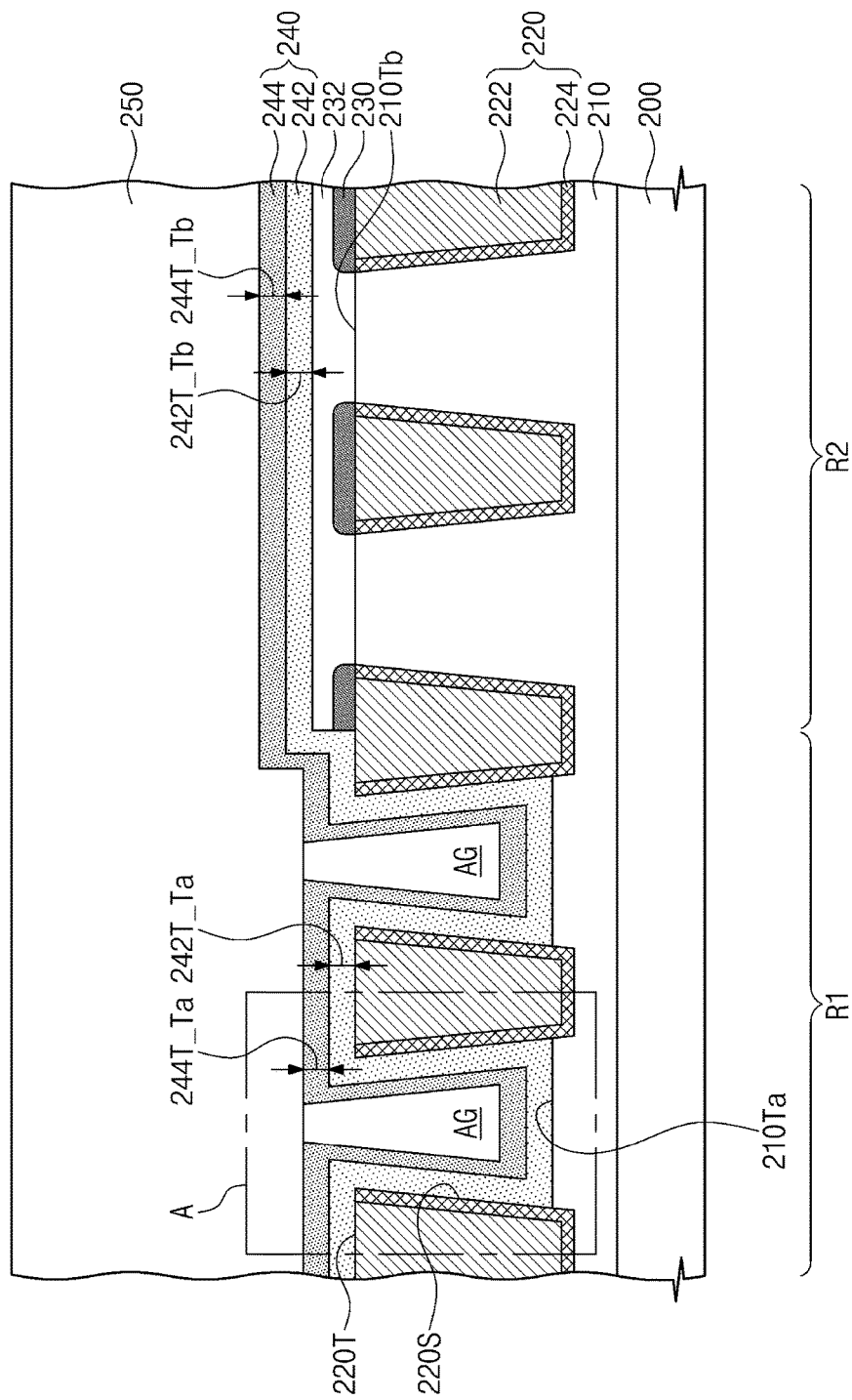

SEMICONDUCTOR DEVICE INCLUDING AIR-GAP

CROSS-REFERENCE TO RELATED APPLICATIONS

This U.S. nonprovisional patent application claims priority under 35 U.S.C. § 119 to Korean Patent Application 10-2016-0120310 filed on Sep. 20, 2016, with the Korean Intellectual Property Office, entire contents of which are hereby incorporated by reference.

BACKGROUND

The present disclosure relates to a semiconductor device, and more particularly, to a semiconductor device including an air gap.

As semiconductor devices have been fine and highly integrated, pitches of metal interconnections of semiconductor devices have been narrowed. Thus, parasitic capacitance of semiconductor devices may increase such that operating speeds of semiconductor devices may be reduced. In order to reduce the parasitic capacitance of semiconductor devices, various research has been conducted for low-resistance metal interconnections and/or low-dielectric constant dielectrics.

SUMMARY

Embodiments of the present disclosure provide a semiconductor device having enhanced reliability.

An objective of the present disclosure is not limited to the above-mentioned one, other objectives which have not been mentioned above will be clearly understood to those skilled in the art from the following description.

According to exemplary embodiments of the present disclosure, a semiconductor device may comprise: a lower structure provided on a substrate and including a recess region; a first barrier layer and a second barrier layer that are sequentially provided on the lower structure, the first and second barrier layers covering an inner surface of the recess region and a top surface of the lower structure, wherein the inner surface of the recess region includes a bottom surface and an inner sidewall connecting the bottom surface to the top surface of the lower structure; and an interlayer dielectric layer provided on the second barrier layer and defining an air gap in the recess region, wherein a first step coverage is defined by a value obtained by dividing a thickness of the first barrier layer on the inner sidewall of the inner surface by a thickness of the first barrier layer on the top surface of the lower structure, wherein a second step coverage is defined by a value obtained by dividing a thickness of the second barrier layer on the inner sidewall of the inner surface of the recess region by a thickness of the second barrier layer on the top surface of the lower structure, and wherein the first step coverage is different from the second step coverage.

According to exemplary embodiments of the present disclosure, a semiconductor device may comprise: a substrate including a first region and a second region; a first interlayer dielectric layer provided on the substrate and having a first top surface on the first region and a second top surface on the second region, the second top surface being positioned higher than the first top surface in a vertical direction from an upper surface of the substrate; first conductive patterns provided on the first interlayer dielectric layer of the first region; a first barrier layer and a second barrier layer that are sequentially provided on the first interlayer dielectric layer and cover the first conductive patterns; and a second interlayer dielectric layer provided on the second barrier layer and defining an air gap between the first conductive patterns. A first step coverage may be defined by a value obtained by dividing a thickness of the first barrier layer on sidewalls of the first conductive patterns by a thickness of the first barrier layer on the second top surface. A second step coverage may be defined by a value obtained by dividing a thickness of the second barrier layer on the sidewalls of the first conductive patterns by a thickness of the second barrier layer on the second top surface. The first step coverage is different from the second step coverage.

According to exemplary embodiments of the present disclosure, a semiconductor device may comprise: a lower structure provided on a substrate and including a recess region having a bottom surface and an inner sidewall, the inner sidewall connecting the bottom surface of the recess region to the top surface of the lower structure; a first barrier layer and a second barrier layer that are sequentially provided on the lower structure, the first and second barrier layers covering the bottom surface and the inner sidewall of the recess region and the top surface of the lower structure; and an interlayer dielectric layer provided on the second barrier layer and defining an air gap in the recess region, wherein a first step coverage is defined by a value obtained by dividing a thickness of the first barrier layer on the inner sidewall of the recess region by a thickness of the bottom surface of the recess region, wherein a second step coverage is defined by a value obtained by dividing a thickness of the second barrier layer on the inner sidewall of the inner surface of the recess region by a thickness of the second barrier layer on the bottom surface of the recess region, and wherein the first step coverage is different from the second step coverage.

BRIEF DESCRIPTION OF THE DRAWINGS

FIG. 3 is a cross sectional view illustrating a semiconductor device according to exemplary embodiments of the present disclosure.

DETAILED DESCRIPTION OF EMBODIMENTS

Figure 1:
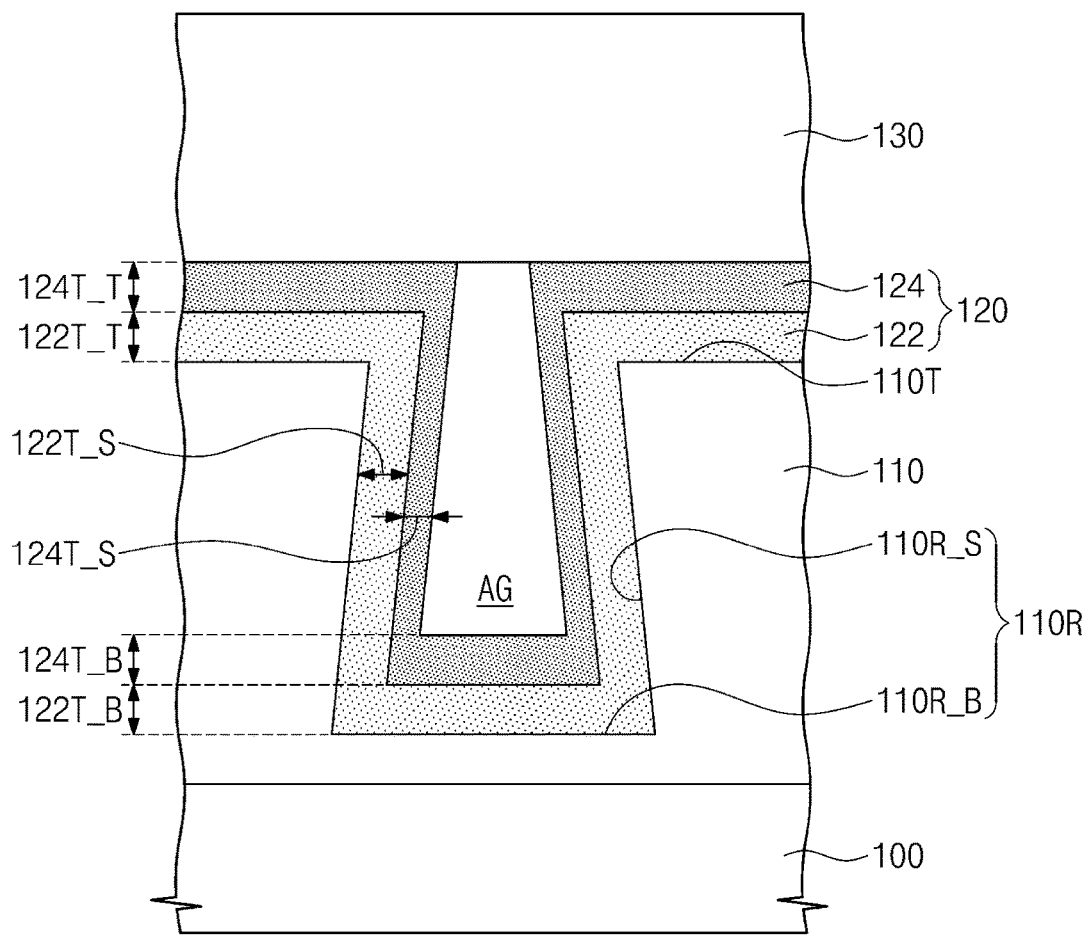
FIG. 1 is a cross sectional view illustrating a semiconductor device according to exemplary embodiments of the present disclosure.

It will be described herein exemplary embodiments of the present disclosure with reference to the accompanying drawings. Like reference numerals may indicate like components throughout the description.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also, these spatially relative terms such as "above" and "below" as used herein have their ordinary broad meanings—for example element A can be above element B even if when looking down on the two elements there is no overlap between them (just as something in the sky is generally above something on the ground, even if it is not directly above). The term "substantially" may be used herein to emphasize this meaning, unless the context or other statements indicate otherwise.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Unless the context indicates otherwise, the terms first, second, third, etc., are used as labels to distinguish one element, component, region, layer or section from another element, component, region, layer or section (that may or may not be similar). Thus, a first element, component, region, layer or section discussed below in one section of the specification (or claim) may be referred to as a second element, component, region, layer or section in another section of the specification (or another claim).

FIG. 1 is a cross sectional view illustrating a semiconductor device according to exemplary embodiments of the present disclosure.

Referring to FIG. 1, a substrate 100 may be provided. The substrate 100 may be, for example, a silicon (Si) substrate, a germanium (Ge) substrate, or a silicon-germanium (SiGe) substrate. The substrate 100 may be provided therein with an integrated circuit (not shown) including transistors and/or memory cells.

A lower structure 110 may be provided on the substrate 100. The lower structure 110 is not limited to its structure and material. For example, the lower structure 110 may include dielectric (e.g., silicon oxide, silicon nitride, and/or silicon oxynitride), conductor (e.g., metal and/or metal nitride), semiconductor (e.g., silicon, germanium, and/or silicon-germanium), and/or any combination thereof.

The lower structure 110 may include a recess region 110R that is recessed toward the substrate 100 from a top surface 110T of the lower structure 110. The recess region 110R may include a bottom surface 110R_B and an inner sidewall 110R_S that connects the bottom surface 110R_B to the top surface 110T of the lower structure 110. In FIG. 1, the bottom surface 110R_B of the recess region 110R is flat, but the present disclosure is not limited thereto. For example, in some embodiments, unlike that illustrated in FIG. 1, the bottom surface 110R_B of the recess region 110R may have a concave shape that protrudes downward.

In some embodiments, the inner sidewall 110R_S of the recess region 110R may be inclined from a direction perpendicular to a top surface of the substrate 100, and thus the recess region 110R may have a width that decreases with increasing distance from the substrate 100. For example, a bottom width of the recess region 110R nearer to the substrate 100 may be greater than a top width of the recess region 110R further from the substrate 100. The present disclosure, however, is not limited thereto.

A barrier layer 120 may be provided on the lower structure 110. The barrier layer 120 may include a first barrier layer 122 and a second barrier layer 124 that are sequentially stacked.

The barrier layer 120 may conformally cover the top surface 110T of the lower structure 110 and an inner surface (i.e., the inner sidewall 110R_S and the bottom surface 110R_B) of the recess region 110R. Hereinafter, the inner sidewall 110R_S and the bottom surface 110R_B of the recess region 110R may be integrally referred to as the inner surface of the recess region 110R. In this configuration, the first and second barrier layers 122 and 124 may be layers extending conformally along the top surface 110T of the lower structure 110 and the inner surface 110R_S and 110R_B of the recess region 110R. The barrier layer 120 may not completely fill the recess region 110R. The barrier layer 120 may not close an entrance of the recess region 110R. For example, the barrier layer 120 may have portions each provided on the inner sidewall 110R_S of the recess region 110R, and the portions of the barrier layer 120 may not contact with each other.

In some embodiments, the first barrier layer 122 may have a thickness 122T_S on the inner sidewall 110R_S of the recess region 110R and a thickness 122T_T on the top surface 110T of the lower structure 110. A first step coverage may be defined by a value obtained by dividing the thickness 122T_S of the first barrier layer 122 on the inner sidewall 110R_S of the recess region 110R by the thickness 122T_T of the first barrier layer 122 on the top surface 110T of the lower structure 110. The thickness 122T_S of the first barrier layer 122 on the inner sidewall 110R_S of the recess region 110R may be less than or equal to the thickness 122T_T of the first barrier layer 122 on the top surface 110T of the lower structure 110. Accordingly, the first step coverage may be greater than 0 and equal to or less than 1.

In some embodiments, the second barrier layer 124 may have a thickness 124T_S on the inner sidewall 110R_S of the recess region 110R and a thickness 124T_T on the top surface 110T of the lower structure 110. A second step coverage may be defined by a value obtained by dividing the thickness 124T_S of the second barrier layer 124 on the inner sidewall 110R_S of the recess region 110R by the thickness 124T_T of the second barrier layer 124 on the top surface 110T of the lower structure 110. The thickness 124T_S of the second barrier layer 124 on the inner sidewall 110R_S of the recess region 110R may be less than or equal to the thickness 124T_T of the second barrier layer 124 on the top surface 110T of the lower structure 110. Accordingly, the second step coverage may be greater than 0 and equal to or less than 1.

In some embodiments, the first barrier layer 122 may have a thickness 122T_B on the bottom surface 110R_B of the recess region 110R and the second barrier layer 124 may have a thickness 124T_B on the bottom surface 110R_B of the recess region 110R. In some embodiments, the thickness 122T_B on the bottom surface 110R_B of the recess region 110R may be substantially equal to the thickness 122T_T on the top surface 110T of the lower structure 110 and the thickness 124T_B on the bottom surface 110R_B of the recess region 110R may be substantially equal to the thickness 124T_T on the top surface 110T of the lower structure 110. For example, in some embodiments, the first step coverage may also be defined by a value obtained by dividing the thickness 122T_S of the first barrier layer 122 on the inner sidewall 110R_S of the recess region 110R by the thickness 122T_B of the first barrier layer 122 on the bottom surface 110R_B of the recess region 110R and the second step coverage may also be defined by a value obtained by dividing the thickness 124T_S of the second barrier layer 124 on the inner sidewall 110R_S of the recess region 110R by the thickness 124T_B of the second barrier layer 124 on the bottom surface 110R_B of the recess region 110R.

The first step coverage may be different from the second step coverage. For example, a difference between the first step coverage and the second step coverage may be a value in the range from about 0.2 to about 0.8. In some embodiments, as shown in FIG. 1, the first step coverage may be greater than the second step coverage. The present disclosure, however, is not limited thereto. In other embodiments, unlike that shown in FIG. 1, the second step coverage may be greater than the first step coverage.

In some embodiments, the first and second barrier layers 122 and 124 may include materials different from each other. For example, the first barrier layer 122 may include one material selected from SiN, SiCN, SiOC, and AlN, and the second barrier layer 124 may include another material selected from SiN, SiCN, SiOC, and AlN. For example, in some embodiments, the first barrier layer 122 may include SiN and the second barrier layer 124 may include SiCN. In other embodiments, the first barrier layer 122 may include SiCN and the second barrier layer 124 may include SiN. However, the disclosure is not limited thereto.

In other embodiments, the first and second barrier layers 122 and 124 may include the same materials but having different composition ratios from each other. For example, each of the first and second barrier layers 122 and 124 may include one material selected from SiN, SiCN, and SiOC, and the material included in the first barrier layer 122 may have a composition ratio different from that of the material included in the second barrier layer 124. For example, the first barrier layer 122 may include one of $Si_{x1}C_{y1}N_{z1}$ (0.45<x1<0.55, 0.15<y1<0.25, 0.25<z1<0.35) and $Si_{x2}C_{y2}N_{z2}$ (0.4<x2<0.5, 0.1<y2<0.2, 0.35<z2<0.45), and the second barrier layer 124 may include the other of $Si_{x1}C_{y1}N_{z1}$ (0.45<x1<0.55, 0.15<y1<0.25, 0.25<z1<0.35) and $Si_{x2}C_{y2}N_{z2}$ (0.4<x2<0.5, 0.1<y2<0.2, 0.35<z2<0.45). In this exemplary embodiment, a step coverage of barrier layer including $Si_{x1}C_{y1}N_{z1}$ may be about 0.3, and a step coverage of barrier layer including $Si_{x2}C_{y2}N_{z2}$ may be about 1.

An interlayer dielectric layer 130 may be provided on the barrier layer 120. The interlayer dielectric layer 130 may extend over, but not fill, the recess region 110R. The recess region 110R may thus include an air gap AG therein. For example, the barrier layer 120 may be provided thereon with the interlayer dielectric layer 130 that extends to close the entrance of the recess region 110R. In some embodiments, as shown in FIG. 1, the air gap AG may extend to a level higher than the top surface 110T of the lower structure 110, but the present disclosure is not limited thereto. In some embodiments, as shown in FIG. 1, the air gap AG may extend to a level higher than the uppermost surface of the first barrier layer 122, but the disclosure is not limited thereto. In some embodiments, as shown in FIG. 1, the air gap AG may extend to a same level as the uppermost surface of second barrier layer 124, but the disclosure is not limited thereto. The interlayer dielectric layer 130 may include silicon oxide, silicon nitride, and/or silicon oxynitride. The air gap AG may include air having low dielectric constant. The term "air" as discussed herein, may refer to atmospheric air, or other gases that may be present during the manufacturing process.

The barrier layer 120 may act to protect the lower structure 110 from external environment (e.g., humidity) or prevent atoms in the lower structure 110 from being diffused outside. Thicknesses, required to perform the functions described above, of the barrier layer 120 on the top surface 110T of the lower structure 110 and on the inner sidewall 110R_S of the recess region 110R may vary depending on a semiconductor device.

According to exemplary embodiments of the disclosure, the barrier layer 120 may include the first barrier layer and the second barrier layer 124 whose step coverages are different from each other. Accordingly, deposition thicknesses of the first and second barrier layers 122 and 124 may be adjusted such that the barrier layer 120 may have a thickness that is properly changed on the top surface 110T of the lower structure 110 and on the inner sidewall 110R_S of the recess region 110R. In some embodiments, deposition thicknesses of the first and second barrier layers 122 and 124 may be adjusted such that the barrier layer 120 may have a thickness that is properly changed on the bottom surface 110R_B of the recess region 110R and on the inner sidewall 110R_S of the recess region 110R. According to exemplary embodiments of the present disclosure, it may be possible to easily meet diverse thickness conditions of the barrier layer 120 that are required for a semiconductor device.

It will be described hereinafter a specific exemplary embodiment of the present disclosure in which the first step coverage of the first barrier layer 122 is about 1 and the second step coverage of the second barrier layer 124 is about 0.3.

In this case, provided that the first barrier layer 122 has the thickness 122T_T of "a" on the top surface 110T of the lower structure 110 and the second barrier layer 124 has the thickness 124T_T of "b" on the top surface 110T of the lower structure 110, "a" may be given to the thickness 122T_S of the first barrier layer 122 on the inner sidewall 110R_S of the recess region 110R and "0.3*b" may be given to the thickness 124T_S of the second barrier layer 124 on the inner sidewall 110R_S of the recess region 110R. Accordingly, "a+b" may be given to a thickness of the barrier layer 120 on the top surface 110T of the lower structure 110, and "a+0.3*b" may be given to a thickness of the barrier layer 120 on the inner sidewall 110R_S of the recess region 110R. It thus may be possible to determine a deposition thickness (i.e., "a") of the first barrier layer 122 and a deposition thickness (i.e., "b") of the second thickness 124 in order to meet a thickness condition of the barrier layer

120 required for a semiconductor device by obtaining a solution of system of linear equations including "a+b", a thickness of the barrier layer 120 on the top surface 110T of the lower structure 110 required for a semiconductor device, and "a+0.3*b", a thickness of the barrier layer 120 on the inner sidewall 110R_S of the recess region 110R required for a semiconductor device.

For example, a semiconductor may require about 100 nm for a thickness of the barrier layer 120 on the top surface 110T of the lower structure 110, and about 50 nm for a thickness of the barrier layer 120 on the inner sidewall 110R_S of the recess region 110R. Therefore, "a" and "b" may be adjusted to about 28.6 nm and about 71.4 nm, respectively, in order to meet a thickness condition of the barrier layer 120 required for a semiconductor device.

In other example, a semiconductor device may require about 100 nm for a thickness of the barrier layer 120 on the top surface 110T of the lower structure 110, and about 70 nm for a thickness of the barrier layer 120 on the inner sidewall 110R_S of the recess region 110R. Therefore, "a" and "b" may be adjusted to about 57.1 nm and about 42.9 nm, respectively, in order to meet a thickness condition of the barrier layer 120 required for a semiconductor device.

According to exemplary embodiments of the present disclosure, an adjustment may be made to deposition thicknesses of the first and second barrier layers 122 and 124 having different step coverages from each other, and thus it may be possible to easily meet diverse thickness conditions of the barrier layer 120 that are required for a semiconductor device. In addition to the embodiment in which the first step coverage of the first barrier layer 122 is about 1 and the second step coverage of the second barrier layer 124 is about 0.3, advantages of the present disclosure discussed above may also be applicable to embodiments in which the first and second step coverages are different from the aforementioned values.

Figure 2A:
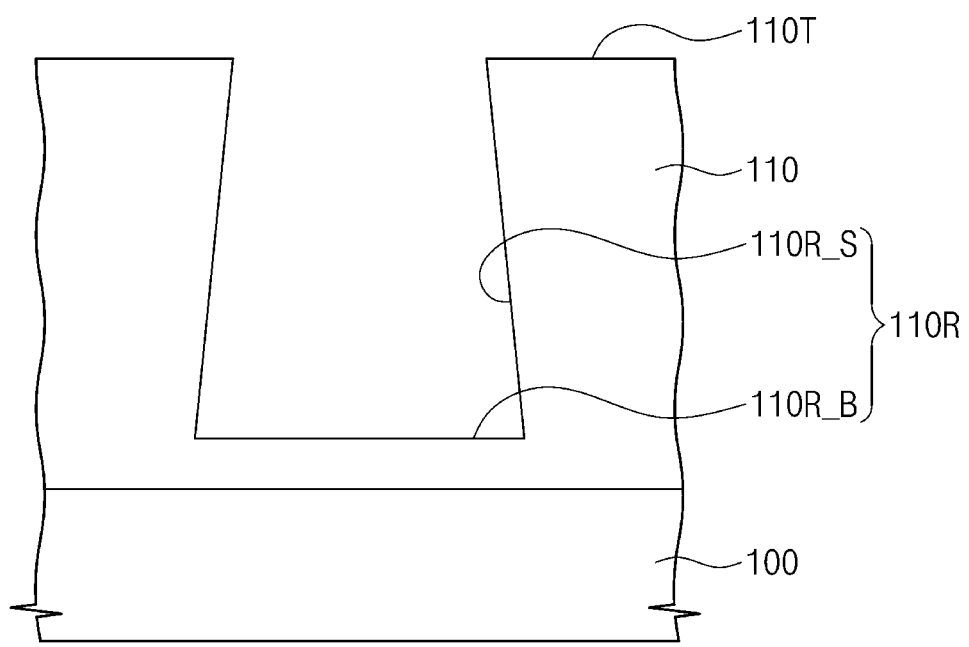
FIGS. 2A and 2B are cross sectional views illustrating a method of fabricating a semiconductor device according to exemplary embodiments of the present disclosure.
Figure 2B:
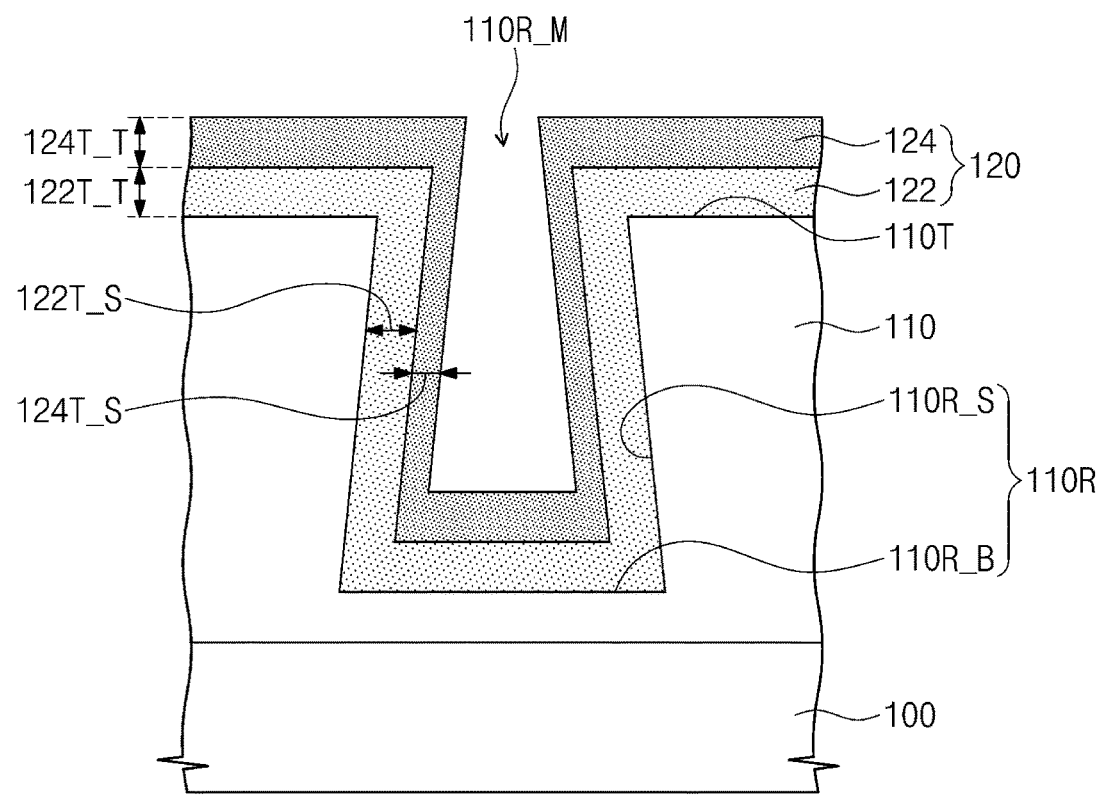

FIGS. 2A and 2B are cross-sectional views illustrating a method of fabricating a semiconductor device according to exemplary embodiments of the present disclosure. Note that those parts substantially the same as those discussed with reference to FIG. 1 are allocated the same reference numerals thereto, and a repetitive description thereof will be omitted.

Referring to FIG. 2A, a lower structure 110 may be formed on a substrate 100. However, the formation of the lower structure 110 is not limited thereto. For example, the formation of the lower structure 110 may include performing a plurality of deposition and/or etching processes.

A recess region 110R may be formed recessed from a top surface 110T of the lower structure 110 toward the substrate 100. However, the formation of the recess region 110R is not limited thereto. For example, the formation of the recess region 110R may include forming a mask pattern (not shown) on the top surface 110T of the lower structure 110 and etching the lower structure 110 using the mask pattern as an etching mask. The recess region 110R may include an inner surface having a bottom surface 110R_B and an inner sidewall 110R_S that connects the bottom surface 110R_B to the top surface 110T of the lower structure 110.

Referring to FIG. 2B, a barrier layer 120 may be formed on the lower structure 110. The barrier layer 120 may be formed to conformally cover the top surface 110T of the lower structure 110 and the inner surface 110R_S and 110R_B of the recess region 110R. The barrier layer 120 may not close an entrance 110R_M of the recess region 110R.

In some embodiments, the formation of the barrier layer 120 may include sequentially forming a first barrier layer 122 and a second barrier layer 124 on the lower structure 110.

The first barrier layer 122 may be formed to conformally cover the top surface 110T of the lower structure 110 and the inner surface 110R_S and 110R_B of the recess region 110R. A first step coverage may be defined by a value obtained by dividing a thickness 122T_S of the first barrier layer 122 on the inner sidewall 110R_S of the recess region 110R by a thickness 122T_T of the first barrier layer 122 on the top surface 110T of the lower structure 110.

The second barrier layer 124 may be formed conformally along the first barrier layer 122. For example, the second barrier layer 124 may be formed to conformally cover the top surface 110T of the lower structure 110 and the inner surface 110R_S and 110R_B of the recess region 110R. A second step coverage may be defined by a value obtained by dividing a thickness 124T_S of the second barrier layer 124 on the inner sidewall 110R_S of the recess region 110R by a thickness 124T_T of the second barrier layer 124 on the top surface 110T of the lower structure 110. The first step coverage may be different from the second step coverage. For example, a difference between the first and second step coverages may be in the range from about 0.2 to about 0.8.

In some embodiments, each of the first and second barrier layers 122 and 124 may be formed by a chemical vapor deposition (CVD) process. For example, the first barrier layer 122 may include one composition selected from $Si_{x1}C_{y1}N_{z1}$ (0.45<x1<0.55, 0.15<y1<0.25, 0.25<z1<0.35) formed using a direct current plasma CVD process and $Si_{x2}C_{y2}N_{z2}$ (0.4<x2<0.5, 0.1<y2<0.2, 0.35<z2<0.45) formed using a pulsed plasma CVD process, and the second barrier layer 124 may include the other composition of $Si_{x1}C_{y1}N_{z1}$ (0.45<x1<0.55, 0.15<y1<0.25, 0.25<z1<0.35) and $Si_{x2}C_{y2}N_{z2}$ (0.4<x2<0.5, 0.1<y2<0.2, 0.35<z2<0.45). In this exemplary embodiment, about 0.3 may be given to a step coverage of barrier layer including $Si_{x1}C_{y1}N_{z1}$ formed using a direct current plasma CVD process, and about 1 may be given to a step coverage of barrier layer including $Si_{x2}C_{y2}N_{z2}$ formed using a pulsed plasma CVD process.

In some embodiments, in order to meet a thickness condition of the barrier layer 120 required for a semiconductor device, an adjustment may be made to the thickness 122T_T of the first barrier layer 122 on the top surface 110T of the lower structure 110 and the thickness 124T_T of the second barrier layer 124 on the top surface 110T of the lower structure 110. In some embodiments, in order to meet a thickness condition of the barrier layer 120 required for a semiconductor device, an adjustment may be made to the thickness 122T_B (as shown in FIG. 1) of the first barrier layer 122 on the bottom surface 110R_B of the recess region 110R and the thickness 124T_B (as shown in FIG. 1) of the first barrier layer 122 on the bottom surface 110R_B of the recess region 110R.

Referring back to FIG. 1, an interlayer dielectric layer 130 may be formed on the barrier layer 120. The interlayer dielectric layer 130 may extend over the recess region 110R to close the entrance (see 110R_M of FIG. 2B) of the recess region 110R. An air gap AG may thus be formed in the recess region 110R and below the interlayer dielectric layer 130. The formation of the interlayer dielectric layer 130 may include, for example, performing a deposition process having low step coverage.

Figure 4:
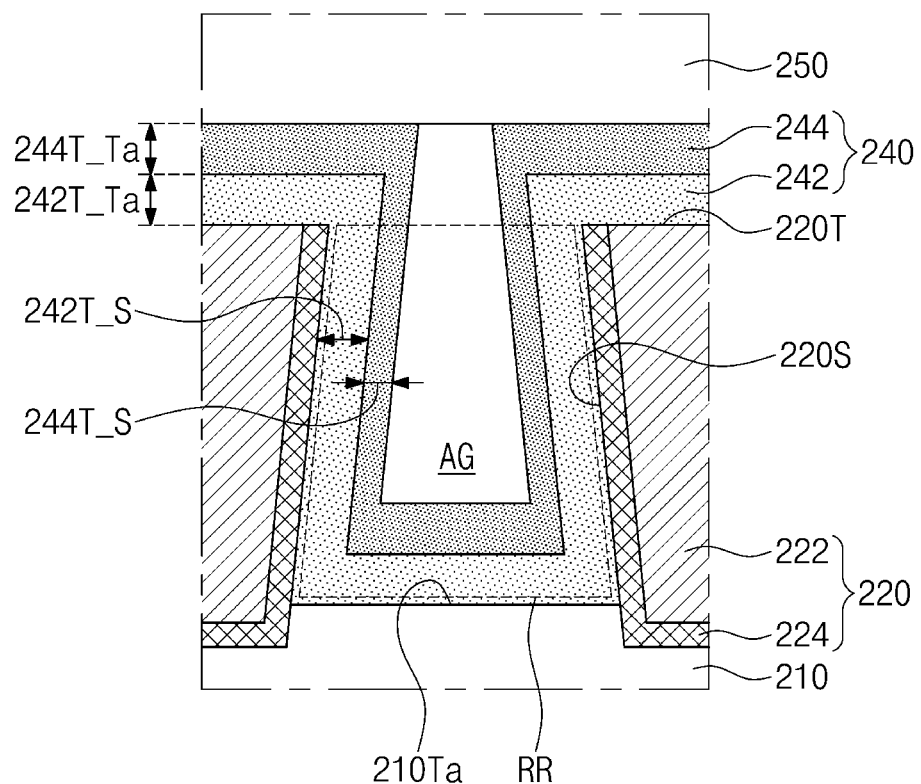
FIG. 4 is an enlarged view of section A shown in FIG. 3 according to exemplary embodiments.

FIG. 3 is a cross-sectional view illustrating a semiconductor device according to exemplary embodiments of the present disclosure. FIG. 4 is an enlarged view of section A shown in FIG. 3.

Referring to FIGS. 3 and 4, a substrate 200 may be provided. The substrate 200 may include a first region R1 and a second region R2. The substrate 200 may be, for example, a silicon (Si) substrate, a germanium (Ge) substrate, or a silicon-germanium (SiGe) substrate. The substrate 200 may be provided therein with an integrated circuit (not shown) including transistors and/or memory cells.

A first interlayer dielectric layer 210 may be provided on the substrate 200. The first interlayer dielectric layer 210 may be an intermetal dielectric (IMD) layer. A top surface 210Ta (e.g., top most surface) of the first interlayer dielectric layer 210 on the first region R1 may be positioned lower than a top surface 210Tb (e.g., top most surface) of the first interlayer dielectric layer 210 on the second region R2. The first interlayer dielectric layer 210 may include, for example, silicon oxide, silicon nitride, and/or silicon oxynitride.

Conductive patterns 220 may be provided on the first and second regions R1 and R2. The conductive patterns 220 on the first region R1 may protrude over the top surface 210Ta of the first interlayer dielectric layer 210, while its lower portion being inserted into the first interlayer dielectric layer 210. The conductive patterns 220 on the second region R2 may be disposed in the first interlayer dielectric layer 210. The conductive patterns 220 on the first and second regions R1 and R2 may be disposed at substantially the same level.

Each of the conductive patterns 220 may include a conductive body pattern 222 and a conductive barrier pattern 224. The conductive body pattern 222 may include, for example, copper and/or tungsten. The conductive barrier pattern 224 may cover a sidewall and a bottom surface of the conductive body pattern 222. The conductive barrier pattern 224 may include, for example, tantalum, tantalum nitride, titanium, titanium nitride, cobalt, and/or ruthenium. The conductive patterns 220 may be connected to the integrated circuit in the substrate 200 through a contact plug (not shown).

Recess regions RR as shown in FIG. 4 may be defined between the conductive patterns 220 adjacent to each other on the first region R1. Each of the recess regions RR may have an inner surface, which may have an inner sidewall defined by facing sidewalls 220S of the conductive patterns 220 adjacent to each other on the first region R1 and a bottom surface defined by the top surface 210Ta of the first interlayer dielectric layer 210 on the first region R1.

Each of the conductive patterns 220 may have a width that increases with increasing distance from the substrate 200. Thus, each of the recess regions RR may have a width that decreases with increasing distance from the substrate 200.

Capping patterns 230 may be provided to cover top surfaces 220T of the conductive patterns 220 on the second region R2. The capping patterns 230 on the second region R2 may be provided locally on the top surfaces 220T of the conductive patterns 220, and therefore the top surface 210Tb of the first interlayer dielectric layer 210 may be exposed on the second region R2. One of the capping patterns 230 may partially cover its underlying top surface 220T of the conductive pattern 220 that is most adjacent to the first region R1, and remaining capping patterns 230 may completely cover their underlying top surfaces 220T of other conductive patterns 220. The capping patterns 230 may include, for example, metal silicide (e.g., cobalt silicide).

A hardmask pattern 232 may be provided on the first interlayer dielectric layer 210 on the second region R2. The hardmask pattern 232 may cover the capping patterns 230 and the top surface 210Tb of the first interlayer dielectric layer 210 on the second region R2. The hardmask pattern 232 may not extend onto the first region R1, and may have an end aligned with an end of the capping pattern 230 that is most adjacent to the first region R1. The hardmask pattern 232 may include, for example, AlN, SiN, and/or SiCN.

A barrier layer 240 may be provided on the first interlayer dielectric layer 210 and the conductive patterns 220. The barrier layer 240 may include a first barrier layer 242 and a second barrier layer 244 that are sequentially stacked.

On the first region R1, the barrier layer 240 may conformally cover the top surfaces 220T of the conductive patterns 220 and the inner surfaces 220S and 210Ta of the recess regions RR. For example, on the first region R1, each of the first and second barrier layers 242 and 244 may conformally cover the top surfaces 220T and the sidewalls 220S of the conductive patterns 220 and also conformally cover the top surface 210Ta of the first interlayer dielectric layer 210. The barrier layer 240 may not close an entrance of each of the recess regions RR. For example, the barrier layer 240 may have portions each provided on the facing sidewalls of the conductive patterns 220 adjacent to each other, and the portions of the barrier layer 240 may not be brought into contact with each other.

On the second region R2, the barrier layer 240 may cover the hardmask pattern 232. For example, the hardmask pattern 232 may have a top surface covered with the barrier layer 240 extending onto the second region R2 from the first region R1.

In some embodiments, the first barrier layer 242 may have a thickness 242T_Ta on the top surfaces 220T of the conductive patterns 220 on the first region R1 and a thickness 242T_Tb on the hardmask pattern 232 on the second region R2. The thickness 242T_Ta may be substantially the same as the thickness 242T_Tb. In some embodiments, the second barrier layer 244 may have a thickness 244T_Ta on the top surfaces 220T of the conductive patterns 220 on the first region R1 and a thickness 244T_Tb on the hardmask pattern 232 on the second region R2. The thickness 244T_Ta may be substantially the same as the thickness 244T_Tb.

A first step coverage may be defined by a value obtained by dividing a thickness 242T_S of the first barrier layer 242 on the sidewalls 220S of the conductive patterns 220 on the first region R1 by the thickness 242T_Tb of the first barrier layer 242 on the hardmask pattern 232 on the second region R2 (or by the thickness 242T_Ta of the first barrier layer 242 on the top surfaces 220T of the conductive patterns 220 on the first region R1). The first step coverage may be greater than 0 and equal to or less than 1.

Likewise, a second step coverage may be defined by a value obtained by dividing a thickness 244T_S of the second barrier layer 244 on the sidewalls 220S of the conductive patterns 220 on the first region R1 by the thickness 244T_Tb of the second barrier layer 244 on the hardmask pattern 232 on the second region R2 (or by the thickness 244T_Ta of the second barrier layer 244 on the top surfaces 220T of the conductive patterns 220 on the first region R1). The second step coverage may be greater than 0 and equal to or less than 1.

The first step coverage may be different from the second step coverage. For example, a difference between the first and second step coverages may be in the range from about 0.2 to about 0.8. In some embodiments, as shown in FIG. 3, the first step coverage may be greater than the second step coverage. The present disclosure, however, is not limited thereto. In other embodiments, unlike that shown in FIG. 1, the second step coverage may be greater than the first step coverage.

In some embodiments, the first and second barrier layers 242 and 244 may include materials different from each other. For example, the first barrier layer 242 may include one material selected from SiN, SiCN, SiOC, and AlN, and the second barrier layer 244 may include another material selected from SiN, SiCN, SiOC, and AlN.

In other embodiments, the first and second barrier layers 242 and 244 may include the same materials but having different composition ratios from each other. For example, each of the first and second barrier layers 242 and 244 may include one material selected from SiN, SiCN, and SiOC, and the material included in the first barrier layer 242 may have a composition ratio different from that of the material included in the second barrier layer 244. For example, the first barrier layer 242 may include one composition of $Si_{x1}C_{y1}N_{z1}$ (0.45<x1<0.55, 0.15<y1<0.25, 0.25<z1<0.35) and $Si_{x2}C_{y2}N_{z2}$ (0.4<x2<0.5, 0.1<y2<0.2, 0.35<z2<0.45), and the second barrier layer 124 may include the other composition of $Si_{x1}C_{y1}N_{z1}$ (0.45<x1<0.55, 0.15<y1<0.25, 0.25<z1<0.35) and $Si_{x2}C_{y2}N_{z2}$ (0.4<x2<0.5, 0.1<y2<0.2, 0.35<z2<0.45). In this case, a step coverage of barrier layer including $Si_{x1}C_{y1}N_{z1}$ may be about 0.3, and a step coverage of barrier layer including $Si_{x2}C_{y2}N_{z2}$ may be about 1.

A second interlayer dielectric layer 250 may be provided on the barrier layer 240. On the first region R1, the second interlayer dielectric layer 250 may extend over, but not fill, the recess regions RR. Each of the recess regions RR may thus include an air gap AG therein. In some embodiments, as shown in FIG. 3, the air gap AG may extend to a level higher than the top surfaces 220T of the conductive patterns 220, but the present disclosure is not limited thereto. In some embodiments, the air gap AG formed in the first region R1 may extend to a level higher than the upper most surface of the hardmask pattern 232, but the disclosure is not limited thereto. The second interlayer dielectric layer 250 may include silicon oxide, silicon nitride, and/or silicon oxynitride.

The air gap AG may include air having low dielectric constant. For example, the air may have dielectric constant (about 1.0006) less than those of the first interlayer dielectric layer 210, the first barrier layer 242, and the second barrier layer 244. As such, the air gap AG may reduce parasitic capacitance between the conductive patterns 220 on the first region R1.

The barrier layer 240 may protect the first interlayer dielectric layer 210 and the conductive patterns 220 from external environment (e.g., humidity) or prevent atoms in the conductive patterns 220 from being diffused outside. Thicknesses, required to perform the functions described above, of the barrier layer 240 on the sidewalls 220S of the conductive patterns 220 provided on the first region R1 and on the hardmask pattern 232 provided on the second region R2 may vary depending on a semiconductor device.

In some embodiments, the barrier layer 240 may include the first barrier layer 242 and the second barrier layer 244 whose step coverages are different from each other. Accordingly, in some embodiments, deposition thicknesses of the first and second barrier layers 242 and 244 may be adjusted to easily change a thickness of the barrier layer 240 provided on the sidewalls 220S of the conductive patterns 220 on the first region R1 and a thickness of the barrier layer 240 provided on the hardmask pattern 232 on the second region R2. According to exemplary embodiments of the present disclosure, it may be possible to easily meet diverse thickness conditions of the barrier layer 240 that are required for a semiconductor device.

Those discussed with reference to FIG. 1 may also be applicable to examples in which deposition thicknesses of the first and second barrier layers 242 and 244 are adjusted to meet diverse thickness conditions of the barrier layer 240 that are required for various semiconductor devices.

FIGS. 5A to 5F are cross-sectional views illustrating a method of fabricating a semiconductor device according to exemplary embodiments of the present disclosure. FIG. 6 is an enlarged view of section B shown in FIG. 5F. Note that those parts substantially the same as those discussed with reference to FIGS. 3 and 4 are allocated the same reference numerals thereto, and a repetitive description thereof will be omitted.

Figure 5A:
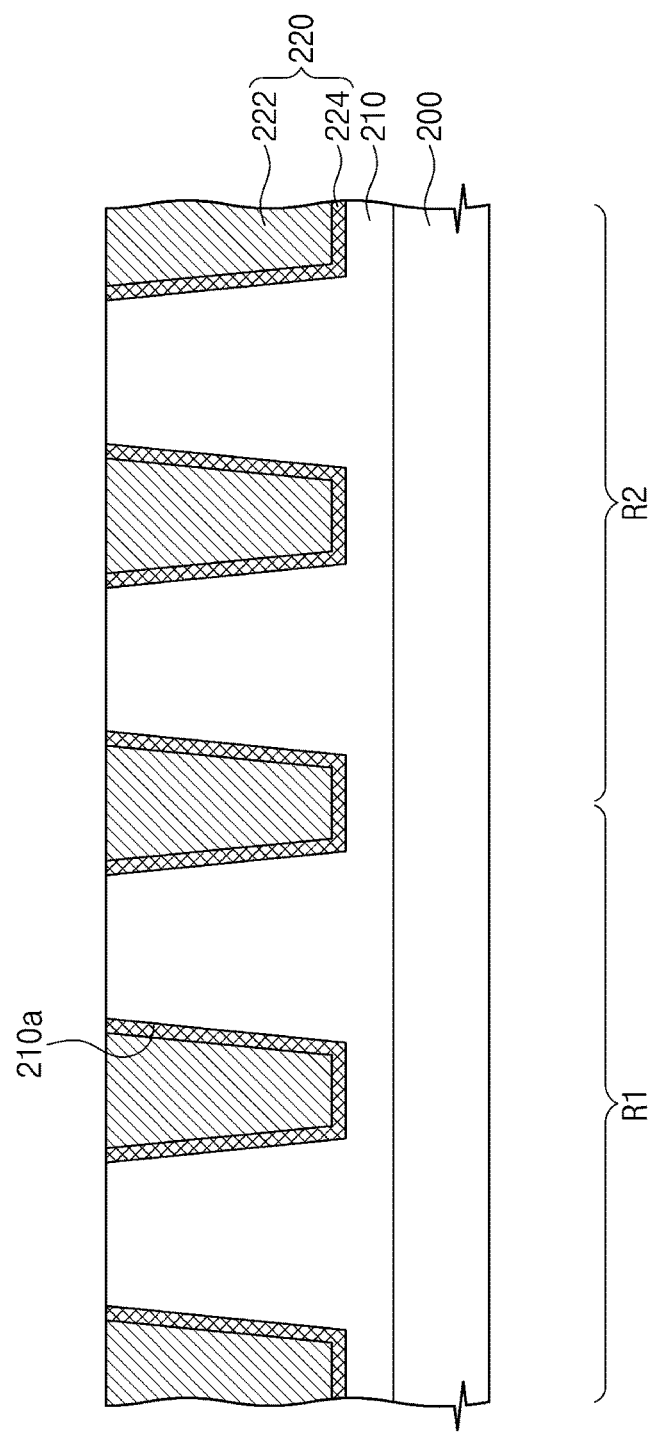
FIGS. 5A to 5F are cross sectional views illustrating a method of fabricating a semiconductor device according to exemplary embodiments of the present disclosure.
Figure 6:
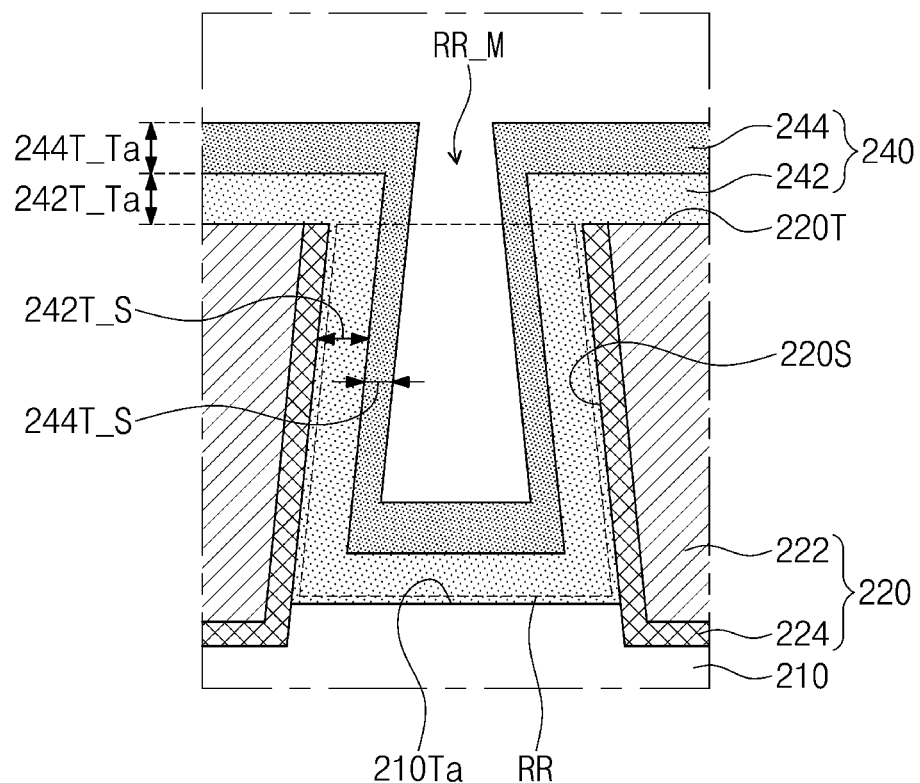
FIG. 6 is an enlarged view of section B shown in FIG. 5F according to exemplary embodiments.

Referring to FIG. 5A, a substrate 200 may be provided. The substrate 200 may include a first region R1 and a second region R2.

A first interlayer dielectric layer 210 may be formed on the substrate 200. The first interlayer dielectric layer 210 may be formed by, for example, a physical vapor deposition (PVD) process or a chemical vapor deposition (CVD) process. The first interlayer dielectric layer 210 may include openings 210a at its upper portion. The first interlayer dielectric layer 210 may be partially etched to form the openings 210a.

Conductive patterns 220 may be formed to fill the openings 210a. The formation of the conductive patterns 220 may include forming a conductive barrier layer (not shown) to conformally cover inner surfaces of the openings 210a, forming a conductive body layer (not shown) to fill the openings 210a, and performing a planarization process until exposing a top surface of the first interlayer dielectric layer 210. Accordingly, each of the conductive patterns 220 may include a conductive body pattern 222 and a conductive barrier pattern 224.

Figure 5B:
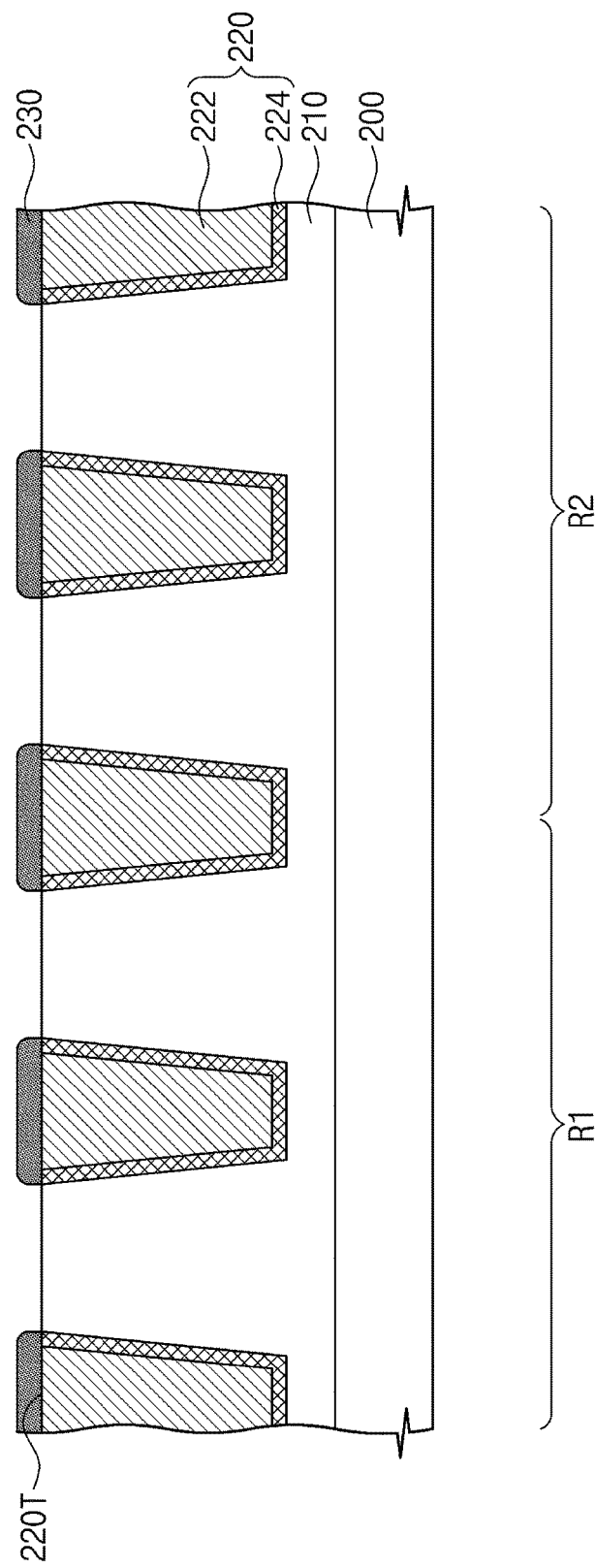

Referring to FIG. 5B, capping patterns 230 may be formed on top surfaces 220T of the conductive patterns 220. The formation of the capping patterns 230 may include forming metal patterns (not shown) locally on the top surfaces 220T of the conductive patterns 220 and performing a silicidation process on the metal patterns.

Figure 5C:
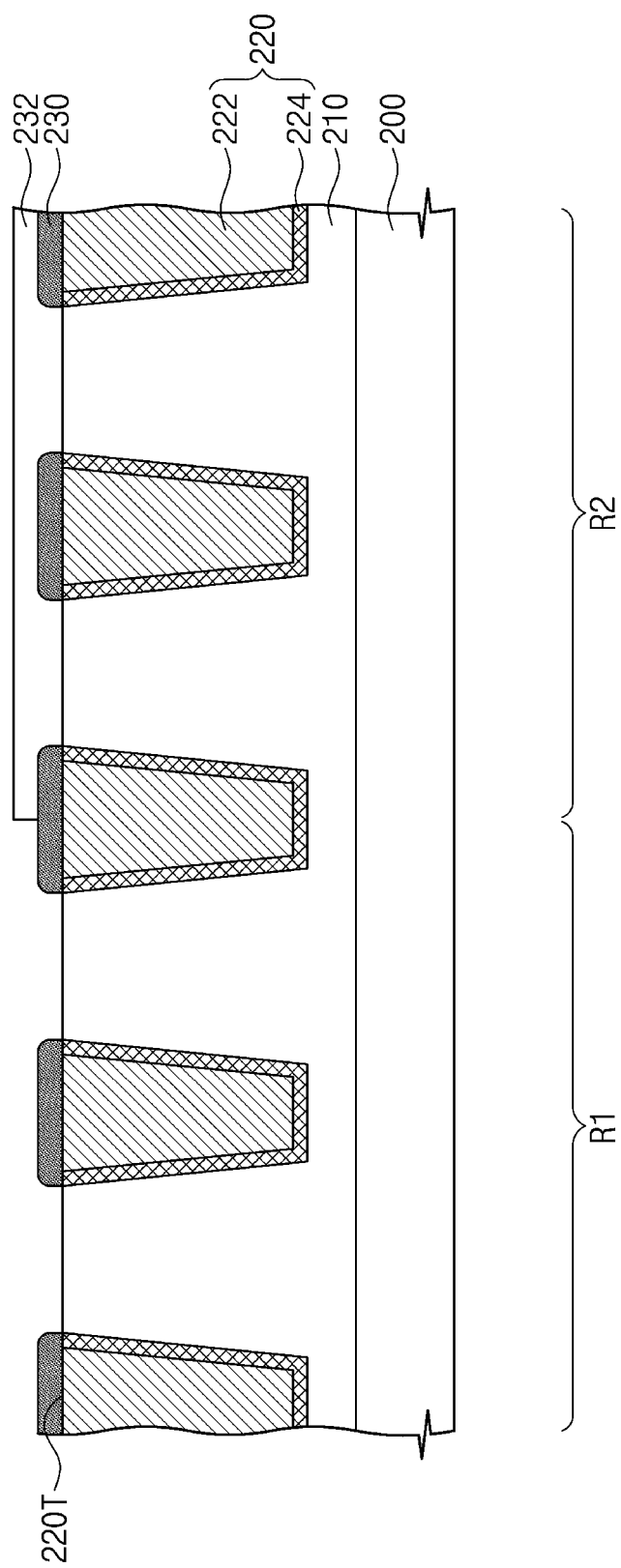

Referring to FIG. 5C, a hardmask patterns 232 may be formed to cover the first interlayer dielectric layer 210 on the second region R2. The hardmask pattern 232 may partially cover the capping pattern 230 on the conductive pattern 220 that is most adjacent to the first region R1 and completely cover the capping patterns 230 on other conductive patterns 220 on the second region R2. The formation of the hardmask pattern 232 may include forming on the first interlayer dielectric layer 210 a hardmask layer (not shown) covering the capping patterns 230 and patterning the hardmask layer. The first interlayer dielectric layer 210 and the capping patterns 230 on the first region R1 may be exposed through the hardmask pattern 232.

Figure 5D:
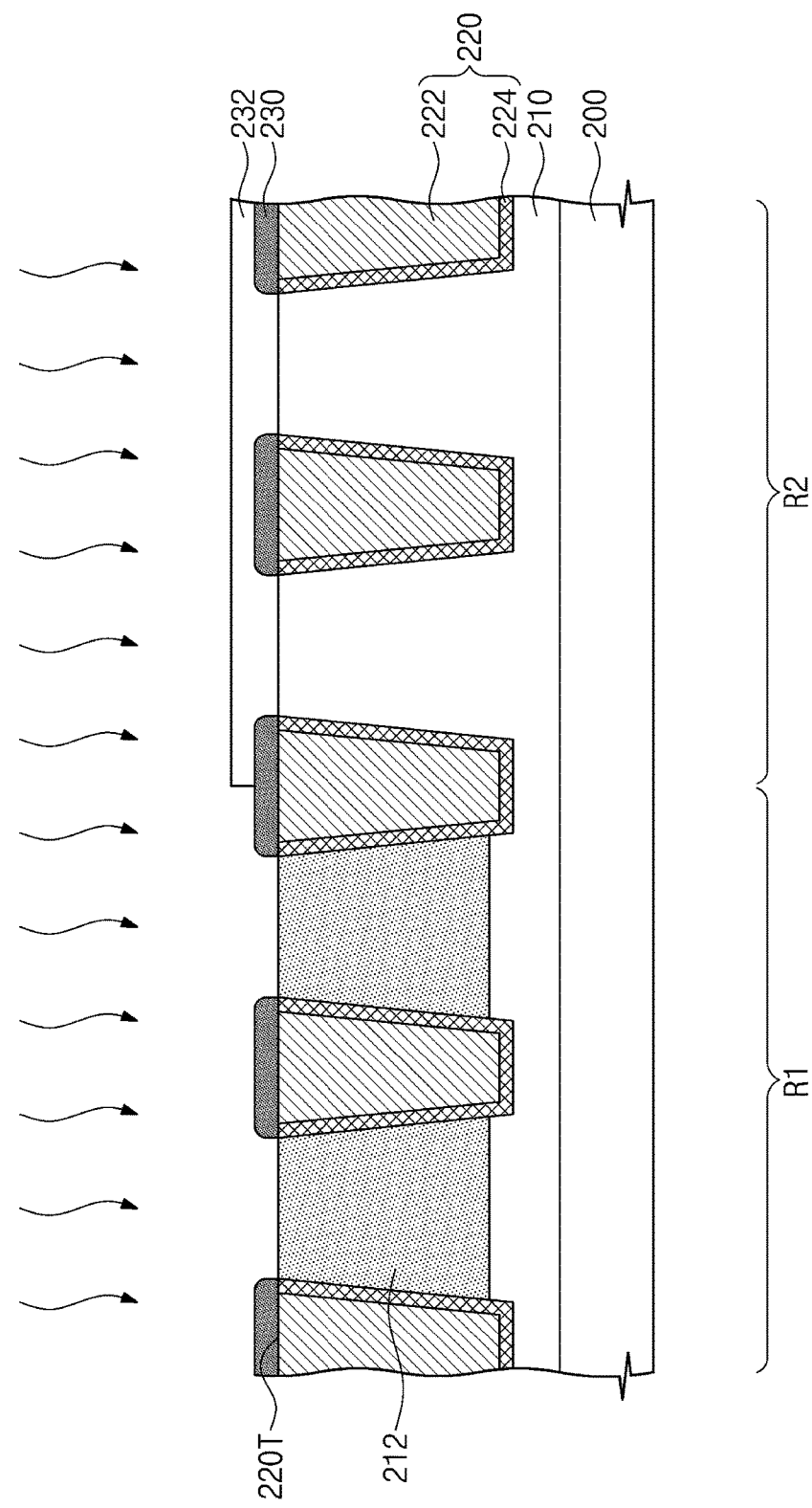
Figure 5E:
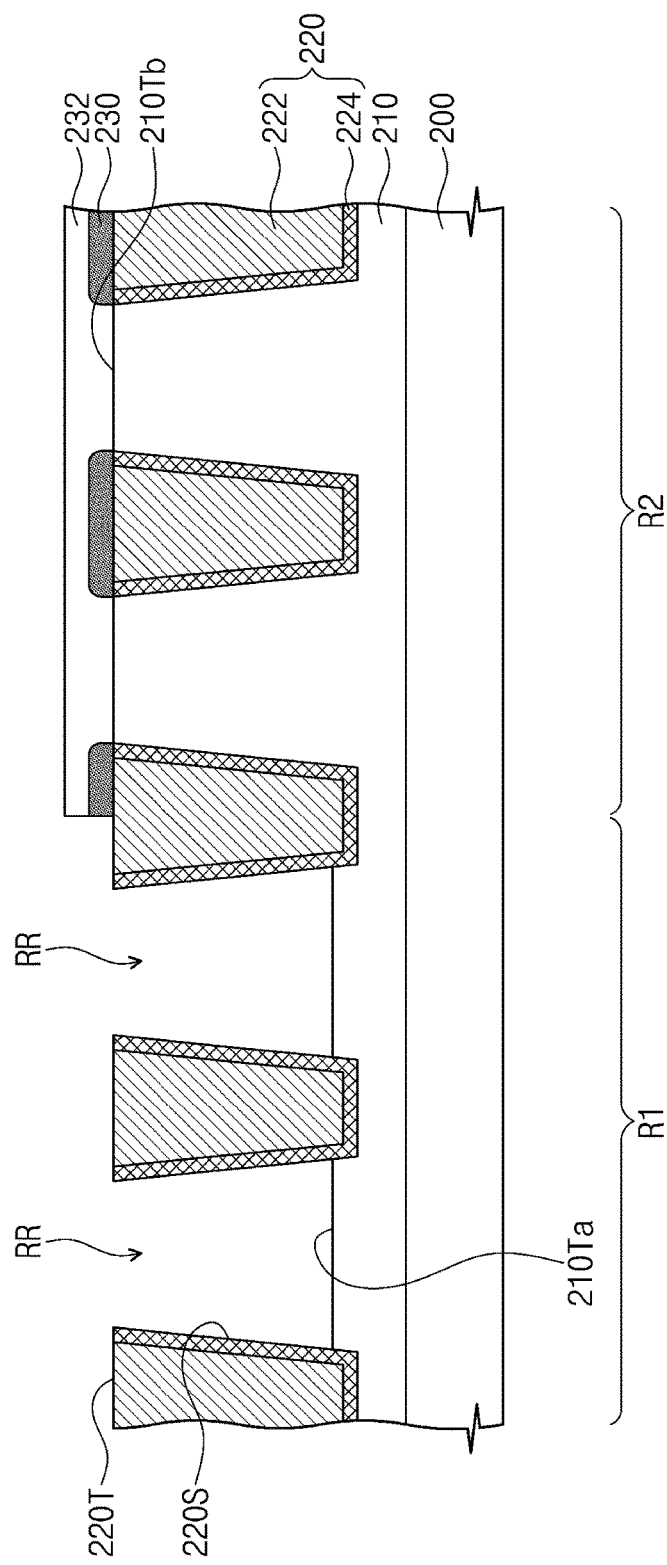

Referring to FIGS. 5D and 5E, the first interlayer dielectric layer 210 on the first region R1 may be etched to form recess regions RR.

The formation of the recess regions RR may include performing a plasma treatment process on an upper portion of the first interlayer dielectric layer 210 on the first region R1 (FIG. 5D) and removing the plasma-damaged upper portion of the first interlayer layer 210 on the first region R1 (FIG. 5E).

Referring to FIG. 5D, the plasma treatment process may be performed at temperature of about 200° C. to about 400°

C. under pressure of about 2 Torr to about 8 Torr. The plasma treatment process may possibly damage the upper portion of the first interlayer dielectric layer 210 on the first region R1. The first interlayer dielectric layer 210 may have a damaged portion 212 whose bottom surface is higher than bottom surfaces of the conductive patterns 220. During the plasma treatment process, the hardmask pattern 232 may protect the first interlayer dielectric layer 210 on the second region R2 such that it may be possible to suppress damages to the first interlayer dielectric layer 210 on the second region R2.

Referring to FIG. 5E, a process may be performed to remove the damaged portion 212 of the first interlayer dielectric layer 210. For example, the damaged portion 212 of the first interlayer dielectric layer 210 may be removed by a wet etching process using hydrofluoric acid (HF). The first interlayer dielectric layer 210 may thus have a top surface 210Ta on the first region R1 and a top surface 210Tb on the second region R2, and the top surface 210Ta may be positioned lower than the top surface 210Tb. The wet etching process may also remove the capping patterns 230 on the first region R1. The capping patterns 230 on the first region R1 may inhibit etching of the conductive patterns 220 on the first region R1 during the wet etching process.

As the damaged portion 212 is removed from the first interlayer dielectric layer 210, the recess regions RR may be formed between the conductive patterns 220 adjacent to each other on the first region R1. Each of the recess regions RR may have an inner sidewall corresponding to facing sidewalls 220S of the conductive patterns 220 adjacent to each other on the first region R1 and may also have a bottom surface corresponding to the top surface 210Ta of the first interlayer dielectric layer 210 on the first region R1. The facing sidewalls 220S of the conductive patterns 220 and the top surface 210Ta of the first interlayer dielectric layer 210 may constitute an inner surface of the recess region RR.

FIGS. 5D and 5E explain an example to form the recess regions RR. However, the present disclosure is not limited thereto, and the recess regions RR may be formed by other processes such as an anisotropic etching.

Figure 5F:
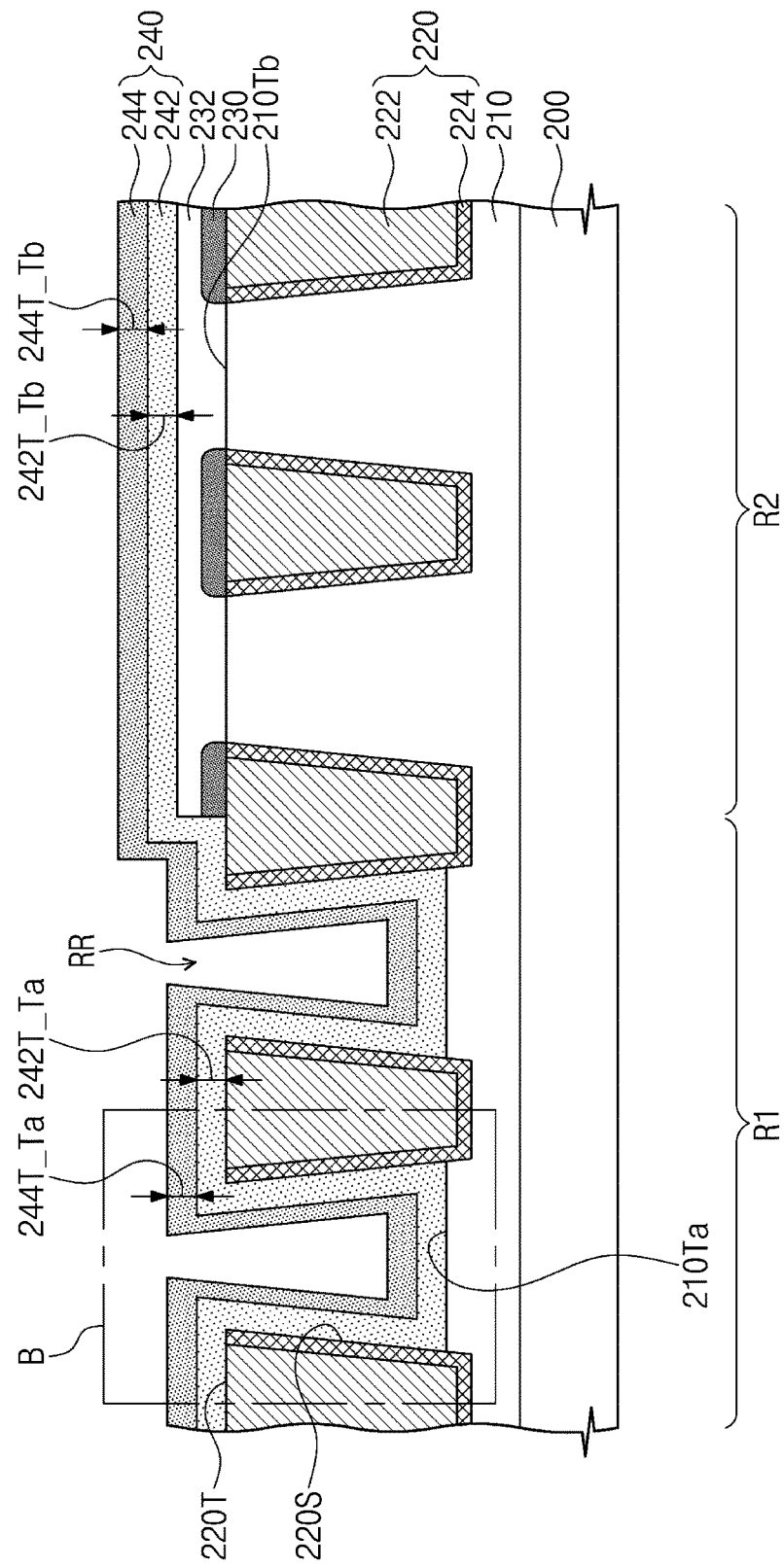

Referring to FIGS. 5F and 6, a barrier layer 240 may be formed to conformally cover the first interlayer dielectric layer 210 and the conductive patterns 220. The formation of the barrier layer 240 may include sequentially forming a first barrier layer 242 and a second barrier layer 244 that conformally cover the first interlayer dielectric layer 210 and the conductive patterns 220.

On the first region R1, the first barrier layer 242 may be formed to conformally cover the top surfaces 220T of the conductive patterns 220 and the inner surfaces 220S and 210Ta of the recess regions RR. The first barrier layer 242 may be formed not to close entrances RR_M of the recess regions RR. On the second region R2, the second barrier layer 244 may be formed to conformally cover the hardmask pattern 232.

A first step coverage may be defined by a value obtained by dividing a thickness 242T_S of the first barrier layer 242 on the sidewalls 220S of the conductive patterns 220 on the first region R1 by a thickness 242T_Tb of the first barrier layer 242 on the hardmask pattern 232 on the second region R2 (or by a thickness 242T_Ta of the first barrier layer 242 on the top surfaces 220T of the conductive patterns 220 on the first region R1). The first step coverage may be greater than 0 and equal to or less than 1.

On the first region R1, the second barrier layer 244 may be formed along the first barrier layer 242 while conformally covering the top surfaces 220T of the conductive patterns 220 and the inner surfaces 220S and 210Ta of the recess regions RR. The second barrier layer 244 may be formed not to close the entrances RR_M of the recess regions RR. On the second region R2, the second barrier layer 244 may be formed along the first barrier layer 242 while conformally covering the hardmask pattern 232.

A second step coverage may be defined by a value obtained by dividing a thickness 244T_S of the second barrier layer 244 on the sidewalls 220S of the conductive patterns 220 on the first region R1 by a thickness 244T_Tb of the second barrier layer 244 on the hardmask pattern 232 on the second region R2 (or by a thickness 244T_Ta of the second barrier layer 244 on the top surfaces 220T of the conductive patterns 220 on the first region R1). The second step coverage may be greater than 0 and equal to or less than 1. The first step coverage may be different from the second step coverage. For example, a difference between the first and second step coverages may be in the range from about 0.2 to about 0.8.

In some embodiments, each of the first and second barrier layers 242 and 244 may be formed by a chemical vapor deposition (CVD) process. For example, the first barrier layer 242 may include one material selected from $Si_{x1}C_{y1}N_{z1}$ (0.45<x1<0.55, 0.15<y1<0.25, 0.25<z1<0.35) formed using a direct current plasma CVD process and $Si_{x2}C_{y2}N_{z2}$ (0.4<x2<0.5, 0.1<y2<0.2, 0.35<z2<0.45) formed using a pulsed plasma CVD process, and the second barrier layer 244 may include the other material of $Si_{x1}C_{y1}N_{z1}$ (0.45<x1<0.55, 0.15<y1<0.25, 0.25<z1<0.35) and $Si_{x2}C_{y2}N_{z2}$ (0.4<x2<0.5, 0.1<y2<0.2, 0.35<z2<0.45). In this case, about 0.3 may be given to a step coverage of barrier layer including $Si_{x1}C_{y1}N_{z1}$ formed using a direct current plasma CVD process, and about 1 may be given to a step coverage of barrier layer including $Si_{x2}C_{y2}N_{z2}$ formed using a pulsed plasma CVD process.

In order to meet a thickness condition of the barrier layer 240 required for a semiconductor device, an adjustment may be made to the thickness 242T_Tb of the first barrier layer 242 provided on the hardmask pattern 232 on the second region R2 and the thickness 244T_Tb of the second barrier layer 244 provided on the hardmask pattern 232 on the second region R2.

Referring back to FIGS. 3 and 4, a second interlayer dielectric layer 250 may be provided on the barrier layer 240. The second interlayer dielectric layer 250 may extend over the recess regions RR such that the entrances (see RR_M of FIG. 6) of the recess regions RR may be closed. An air gap AG may thus be formed in each of the recess regions RR and below the second interlayer dielectric layer 250. The formation of the second interlayer dielectric layer 250 may include, for example, performing a deposition process having low step coverage.

According to exemplary embodiments of the present disclosure, the barrier layer may include the first and second barrier layers having different step coverages from each other. Therefore, deposition thicknesses of the first and second barrier layers may be adjusted to properly change a thickness of the barrier layer on the top surface of the lower structure and a thickness of the barrier layer on the inner sidewall of the recess region. It thus may be possible to easily meet diverse thickness conditions of the barrier layer that are required for a semiconductor device.

Although the present invention has been described in connection with the embodiments of the present invention illustrated in the accompanying drawings, it will be understood to those skilled in the art that various changes and modifications may be made without departing from the technical spirit and essential feature of the present invention.

It thus should be understood that the above-described embodiments are not limiting but illustrative in all aspects.

What is claimed is:

1. A semiconductor device, comprising:
a lower structure provided on a substrate and including a recess region having a bottom surface and an inner sidewall, the inner sidewall connecting the bottom surface of the recess region to a top surface of the lower structure;
a first barrier layer and a second barrier layer that are sequentially provided on the lower structure, the first and second barrier layers covering the bottom surface and the inner sidewall of the recess region and the top surface of the lower structure; and
an interlayer dielectric layer provided on the second barrier layer and defining an air gap in the recess region,
wherein a first step coverage is defined by a value obtained by dividing a thickness of the first barrier layer on the inner sidewall of the recess region by a thickness of the bottom surface of the recess region,
wherein a second step coverage is defined by a value obtained by dividing a thickness of the second barrier layer on the inner sidewall of the recess region by a thickness of the second barrier layer on the bottom surface of the recess region,
wherein the first step coverage is different from the second step coverage, and
wherein bottommost surface of the interlayer dielectric layer is at the same level as uppermost surface of the second barrier layer.

2. The semiconductor device of claim 1, wherein the inner sidewall of the recess region is inclined from a direction perpendicular to a top surface of the substrate such that a bottom width of the recess region in a first direction nearer to the substrate is greater than a top width of the recess region in the first direction further from the substrate.

3. The semiconductor device of claim 1, wherein
the first barrier layer comprises one material selected from SiN, SiCN, SiOC, and AlN, and
the second barrier layer comprises another material selected from SiN, SiCN, SiOC, and AlN different from the one material selected for the first barrier layer.

4. The semiconductor device of claim 1, wherein the first and second barrier layers comprise one material selected from SiN, SiCN, and SiOC,
the material included in the first barrier layer having a composition ratio different from that of the material included in the second barrier layer.

5. The semiconductor device of claim 1, wherein the air gap extends to a level higher than an uppermost surface of the first barrier layer.

6. A semiconductor device, comprising:
a lower structure provided on a substrate and including a recess region;
a first barrier layer and a second barrier layer that are sequentially provided on the lower structure, the first and second barrier layers covering an inner surface of the recess region and a top surface of the lower structure, wherein the inner surface of the recess region includes a bottom surface and an inner sidewall connecting the bottom surface to the top surface of the lower structure; and
an interlayer dielectric layer provided on the second barrier layer and defining an air gap in the recess region,
wherein a first step coverage is defined by a value obtained by dividing a thickness of the first barrier layer on the inner sidewall of the inner surface of the recess region by a thickness of the first barrier layer on the top surface of the lower structure,
wherein a second step coverage is defined by a value obtained by dividing a thickness of the second barrier layer on the inner sidewall of the inner surface of the recess region by a thickness of the second barrier layer on the top surface of the lower structure,
wherein the first step coverage is different from the second step coverage, and
wherein bottommost surface of the interlayer dielectric layer is at the same level as uppermost surface of the second barrier layer.

7. The semiconductor device of claim 6, wherein
the first barrier layer comprises one material selected from SiN, SiCN, SiOC, and AlN, and
the second barrier layer comprises another material selected from SiN, SiCN, SiOC, and AlN different from the one material selected for the first barrier layer.

8. The semiconductor device of claim 6, wherein the first and second barrier layers comprise one material selected from SiN, SiCN, and SiOC,
the material included in the first barrier layer having a composition ratio different from that of the material included in the second barrier layer.

9. The semiconductor device of claim 6, wherein a difference between the first and second step coverages is a value within a range from about 0.2 to about 0.8.

10. The semiconductor device of claim 6, wherein the first barrier layer and the second barrier layer do not close an entrance of the recess region.

11. The semiconductor device of claim 10, wherein the interlayer dielectric layer extends over the recess region to define the air gap.

12. A semiconductor device, comprising:
a substrate including a first region and a second region;
a first interlayer dielectric layer provided on the substrate and having a first top surface on the first region and a second top surface on the second region, the second top surface being positioned higher than the first top surface in a vertical direction from an upper surface of the substrate;
first conductive patterns provided on the first interlayer dielectric layer of the first region;
a first barrier layer and a second barrier layer that are sequentially provided on the first interlayer dielectric layer and cover the first conductive patterns; and
a second interlayer dielectric layer provided on the second barrier layer and defining an air gap between the first conductive patterns,
wherein a first step coverage is defined by a value obtained by dividing a thickness of the first barrier layer on sidewalls of the first conductive patterns by a thickness of the first barrier layer on the second top surface,
wherein a second step coverage is defined by a value obtained by dividing a thickness of the second barrier layer on the sidewalls of the first conductive patterns by a thickness of the second barrier layer on the second top surface,
wherein the first step coverage is different from the second step coverage, and
wherein bottommost surface of second the interlayer dielectric layer is at the same level as uppermost surface of the second barrier layer.

13. The semiconductor device of claim 12, wherein
the first barrier layer comprises one material selected from SiN, SiCN, SiOC, and AlN, and
the second barrier layer comprises another material selected from SiN, SiCN, SiOC, and AlN different from the one material selected for the first barrier layer.

14. The semiconductor device of claim 12, wherein the second barrier layer comprises portions respectively on facing sidewalls of the first conductive patterns adjacent to each other, the portions of the second barrier layer being spaced apart from each other.

15. The semiconductor device of claim 12, wherein a difference between the first and second step coverages is a value within a range from about 0.2 to about 0.8.

16. The semiconductor device of claim 12, wherein each of the first conductive patterns has a bottom surface positioned lower than the first top surface.

17. The semiconductor device of claim 12, wherein the first and second barrier layers comprise one material selected from SiN, SiCN, and SiOC,
the material included in the first barrier layer having a composition ratio different from that of the material included in the second barrier layer.

18. The semiconductor device of claim 17, wherein
the first barrier layer comprises $Si_{x1}C_{y1}N_{z1}$ ($0.45<x1<0.55$, $0.15<y1<0.25$, $0.25<z1<0.35$), and
the second barrier layer comprises $Si_{x2}C_{y2}N_{z2}$ ($0.4<x2<0.5$, $0.1<y2<0.2$, $0.35<z2<0.45$).

19. The semiconductor device of claim 12, further comprising second conductive patterns in the first interlayer dielectric layer on the second region.

20. The semiconductor device of claim 19, further comprising a hardmask layer provided between the second top surface and the first barrier layer.

* * * * *